United States Patent
Lindkamp et al.

(10) Patent No.: US 9,480,181 B2
(45) Date of Patent: Oct. 25, 2016

(54) HOUSING FOR ACCOMMODATING AN ELECTRIC CIRCUIT BOARD

(71) Applicant: Harting Electronics GmbH, Espelkamp (DE)

(72) Inventors: Marc Lindkamp, Luebbecke (DE); Rainer Bussmann, Bad Essen (DE)

(73) Assignee: HARTING ELECTRONICS GMBH, Espelkamp (DE)

( * ) Notice: Subject to any disclaimer, the term of this patent is extended or adjusted under 35 U.S.C. 154(b) by 109 days.

(21) Appl. No.: 14/389,844

(22) PCT Filed: Mar. 14, 2013

(86) PCT No.: PCT/DE2013/100099
§ 371 (c)(1),
(2) Date: Oct. 1, 2014

(87) PCT Pub. No.: WO2013/156022
PCT Pub. Date: Oct. 24, 2013

(65) Prior Publication Data
US 2015/0070859 A1   Mar. 12, 2015

(30) Foreign Application Priority Data

Apr. 18, 2012   (DE) .................... 10 2012 103 359

(51) Int. Cl.
*H05K 5/00*   (2006.01)
*H05K 7/14*   (2006.01)

(52) U.S. Cl.
CPC ............ *H05K 7/1427* (2013.01); *H05K 5/006* (2013.01); *H05K 7/142* (2013.01); *H05K 5/0047* (2013.01); *H05K 5/0052* (2013.01); *H05K 7/1417* (2013.01); *H05K 2203/167* (2013.01); *Y10S 174/34* (2013.01); *Y10S 174/35* (2013.01)

(58) Field of Classification Search
CPC .... H05K 7/142; H05K 5/006; H05K 7/1417; H05K 5/0047; H05K 5/0052; H05K 2203/167; H05K 7/1427; Y10S 174/34; Y10S 174/35; G06K 19/077; B60R 16/0239
USPC ....... 361/736, 742, 748, 752, 758, 767, 796, 361/807, 808, 810; 439/325, 569, 570, 571
See application file for complete search history.

(56) References Cited

U.S. PATENT DOCUMENTS

| | | | |
|---|---|---|---|
| 5,672,844 A * | 9/1997 | Persson | H05K 9/0039 174/351 |
| 6,249,442 B1 | 6/2001 | Watanabe | |
| 2005/0048850 A1* | 3/2005 | Zoller | B60R 16/0239 439/761 |

FOREIGN PATENT DOCUMENTS

| | | |
|---|---|---|
| CN | 1142872 | 2/1997 |
| CN | 101742839 | 6/2010 |

(Continued)

*Primary Examiner* — James Wu
(74) *Attorney, Agent, or Firm* — Jacobson Holman, PLLC

(57) ABSTRACT

In a housing 1 for receiving an electric circuit board 50 it is proposed to provide in a first housing half 2 of the housing 1 a plurality of bearing pads 20, 21 located at various levels. These bearing pads 20, 21 receive, together with counter bearing pads 30, 31 provided in a second housing half 30, the electric circuit board 50. A plurality of support points 55, 56 is provided on the electric circuit board 50, each of which support points 55, 56 is respectively associated with the bearing pads 20, 21 and counter bearing pads 30, 31. By removing individual support points 55, 56, the bearing pads 20, 21 and counter bearing pads 30, 31 are selected, on which the circuit board 50 is supposed to rest. By selecting the bearing pads 20, 21 and counter bearing pads 30, 31 lying at different levels, the level of the electric circuit board 50 in the housing 1 is determined.

7 Claims, 4 Drawing Sheets

(56) References Cited

FOREIGN PATENT DOCUMENTS

| | | |
|---|---|---|
| CN | 102340961 | 2/2012 |
| DE | 69427128 | 8/2001 |
| DE | 102005002138 | 7/2006 |
| JP | 2-142598 | 12/1990 |
| JP | H08116184 | 5/1996 |
| WO | WO 95/14288 | 5/1995 |

\* cited by examiner

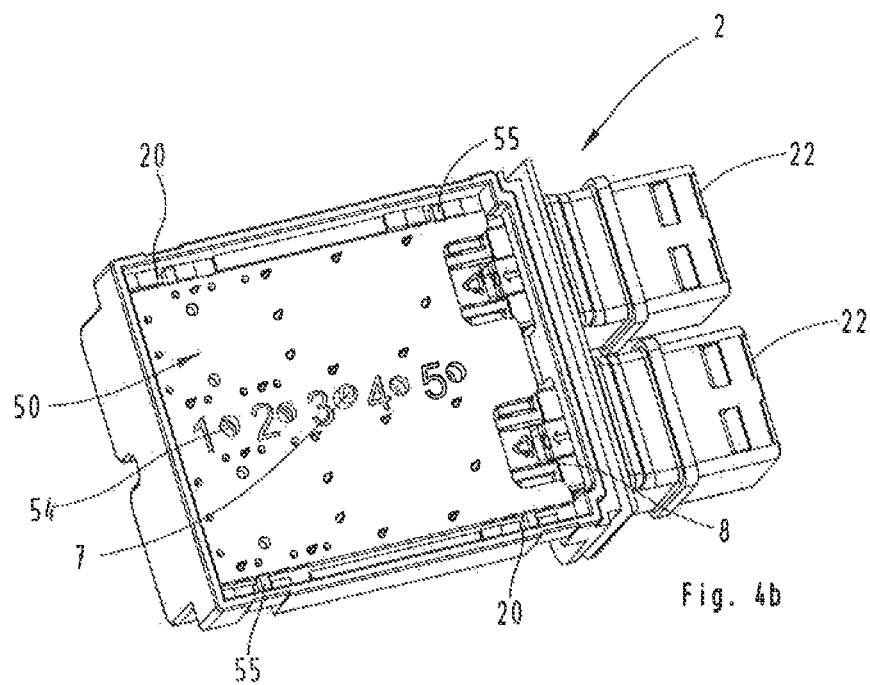
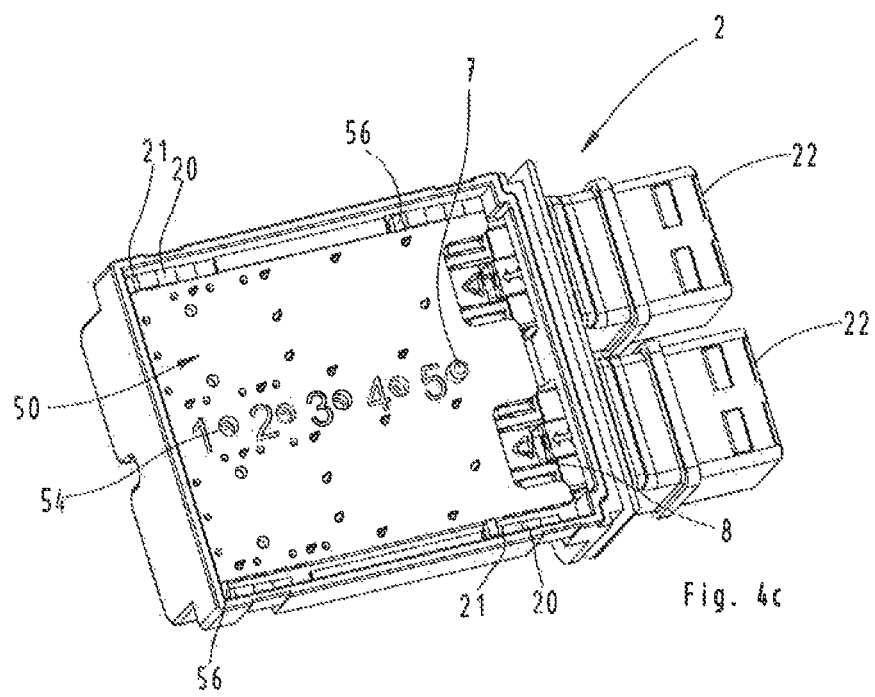

HOUSING FOR ACCOMMODATING AN ELECTRIC CIRCUIT BOARD

The invention relates to a housing as well as to an electric circuit board to be received in a housing.

Such housings, which are made up from moulded parts, for receiving electric circuit boards are known in the most varied shapes and sizes from the prior art. The moulded parts forming the housing part are mostly made from plastics. The housings receive circuit boards for the most varied functions, for example for data communication devices. The circuit boards routinely include interfaces, power supply connections as well as operating elements, which are accessible via at least one contacting opening in the housing. To this end, connecting flanges and/or latching elements are frequently present for the components to be received in the interfaces or connections.

From DE 10 2005 002 138 A1, for example, a housing for receiving electric circuit boards is known, which includes guiding elements as well as displaceable and lockable holding elements. The holding elements can be attached to the lateral edges of the circuit board and fix the latter. By displacing the holding elements, the position of the circuit board can be varied.

From DE 694 27 128 T2, an IC card is known which consists of a two-piece housing with a circuit board received therein. In the housing halves, a plurality of support points provided in a step-wise manner is provided, each of which forms a level for the circuit board to be received. Depending on how the recesses are formed on the circuit board to be received, the circuit board rests on other support points and thus levels in the housing halves.

From U.S. Pat. No. 6,249,442 B1, a receptacle for circuit boards is known that can receive a plurality of circuit boards on different levels. The different levels are here realised by spacer sleeves which are inserted between the circuit boards. The first circuit board rests on support points of a housing. On this circuit board, a spacer sleeve is positioned, onto which in turn a further circuit board is placed. By means of a second housing, the two circuit boards as well as the spacer sleeve located therebetween and a further spacer sleeve constituting a compensator are held and fixed. In order to realise different levels of the circuit boards, spacer sleeves of different thicknesses have to be used.

What has a disadvantageous effect here is that an orientation of the circuit boards merely in two dimensions—namely in the plane of the circuit board itself—is possible. In case dimensions of for example interface modules attached to the circuit boards deviate, also an adjustment of the circuit board perpendicularly to their plane might be necessary. Only in this way a perfect matching of the connection points present on the circuit boards with latching elements moulded to the housing can be ensured.

Moreover, additional holding elements are necessary for the solutions known from the prior art. These may get lost and cause additional costs for production and assembly.

OBJECT OF THE INVENTION

The invention is therefore based on the object of implementing a housing for receiving electric circuit boards in such a way that production- and model-related dimensions can be adjusted both on the plane of the circuit board and perpendicularly to the plane of the circuit board. Moreover, an alignment of the circuit board in the housing is to be enabled without any additional holding elements.

Advantageous embodiments of the invention are indicated in the dependent claims.

The invention relates to a housing consisting of a first housing half and a second housing half. The two housing halves form, when assembled, the housing that surrounds a cavity. The cavity in the housing is intended for receiving an electric circuit board.

The housing halves are preferably made from polymer mouldings. These may be produced in any desired shape using an injection moulding method, and receive the circuit board in an electrically non-conductive manner.

For receiving and positioning the electric circuit board, the two housing halves have a group of supports, on which the circuit board rests with support points. In this connection, a first surface of the support points rests on the bearing pads of the first housing half. A second surface of the support points rests on the counter bearing pads of the second housing half.

Depending on the distance of the bearing pads and the counter bearing pads from each other as well as on the thickness of the circuit board, the latter is held between the supports either so as to be slightly movable with some play or with some excess size under pressure in a stationary manner.

In order to achieve the object according to the invention, at least one second group of supports is moulded onto the housing halves. The second bearing pads and counter bearing pads are positioned on a level that extends, laterally offset, parallel to the first level of the second group of supports. As a result, the circuit board, depending on which group of supports it is received by, can be arranged on different levels.

The number of support groups can here be varied as desired as a function of the required resolution of the graduation in which a circuit board is to be received in a housing.

Also the number of support pairs—bearing pads in the first housing half and associated counter bearing pads in the second housing half—can be varied as a function of the application and the design of the circuit board and the housing. Thus, in a preferred embodiment, the housing has four bearing pads as well as four associated counter bearing pads, and the circuit board has four support points. In this connection, the support pairs are respectively located between a bearing pad and a counter bearing pad.

In a further embodiment, not every bearing pad has exactly one counter bearing part associated therewith. It is also conceivable that only one counter bearing pad is provided between two bearing pads, or the other way round. The entire housing is thus equipped with four bearing pads and just two counter bearing pads. It would also be conceivable to have any other combination of bearing pads and counter bearing pads, but this will not be explained in any more detail herein.

Moreover, according to the invention it is contemplated to provide the circuit board for receiving the various support groups in the housing with various support point groups. In this case, the circuit board has exactly as many support points as the housing has bearing pads and counter bearing pads. Provided the housing has support pairs, the latter will only have one support point of the circuit board associated therewith.

Depending on the level on which the circuit board is to be received in the housing, the excess support points may be removed from the circuit board. To this end, weakened material regions, so-called predetermined breaking points, are provided on the support points. These may be realised by a perforation or a tapering in the material of the circuit board. It would also be conceivable to score the surface at the desired breaking point in order to generate tensions for breaking off.

Each support point group on the circuit board has associated therewith a certain support group—and thus also a level—in the housing. Thus, by removing the support points on the circuit board, the level and group of supports in the housing is defined on which the remaining support points rest.

Further, the circuit board and at least one of the housing halves are provided with bores for inserting a positioning pin. By means of the positioning pin, the position of the circuit board in the housing on the level defined by the support points and supports is determined.

The bores in the at least one housing half form position receptacles. The position receptacles preferably extend in a linear manner. The bores in the circuit board form position bores, which are preferably present in the same number as the position receptacles in the at least one housing half. The position bores are also orientated in a linear manner corresponding to the position receptacles and are each associated with one position receptacle.

According to the invention, the distances of the position receptacles are different to the distances of the position bores. As a result, the position of the circuit board in the housing changes as a function of which position receptacle and position bore a position pin is inserted into. Thus, a variable orientation of the circuit board linearly along the bores becomes possible.

EMBODIMENT EXAMPLE

An embodiment example of the invention is shown in the drawing and will be explained in more detail below, wherein:

FIGS. 4a-4c show a first housing half with an inserted circuit board; and

Figure 1:
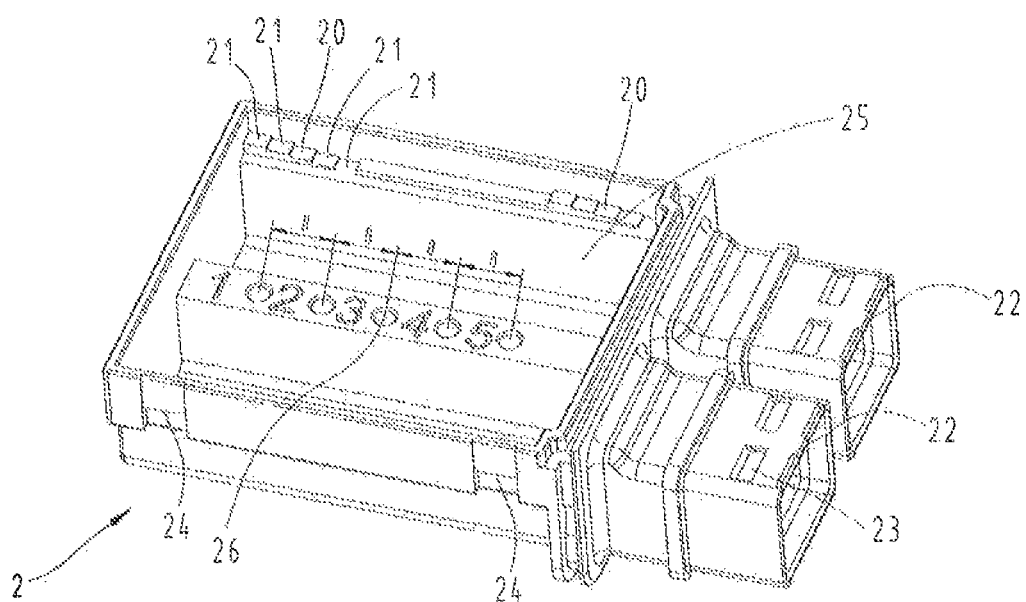
FIG. 1 shows a first housing half.

In FIG. 1, a three-dimensional view of a first housing half 2 is shown. The housing half 2, which is open on one side, forms a housing 1 together with a second housing half 3. On the side thereof that is shown on the right, the first housing half 2 has two contacting openings 22. These are provided for contacting electric components that are to be received in housing half 2 (not shown here).

In this embodiment example, the contacting openings 22 are formed to have the general shape of a flange and have latching means 23. The latching means 23 are used for latching a plug-on connector 9 with the housing 1.

The cavity 25 formed by the first housing half 2 is used for receiving an electric circuit board 50. In each of the lateral walls of the first housing half 2, two supports in the form of bearing pads 20 are provided opposite each other, two are visible, two are not visible due to the representation. These are used for supporting a circuit board 50.

According to the invention, apart from the bearing pads 20, further bearing pads 21 are provided in the first housing half 2. These further bearing pads 21 are moulded next to the bearing pads 20 in a step-wise manner, in this embodiment example, two each at a higher level to the left of the receptacle 20 and two on a lower level to the right of the receptacle 20.

The bearing pads 20, 21 are each moulded onto the visible wall of the first housing half 2 as well as onto the wall that cannot be seen. As a result, four bearing pads are obtained on each of the five levels.

In the cavity 25 of the first housing half 2, five bores are centrally provided in an elongate web. These bores form position receptacles 26 and are used for receiving a positioning pin 7. The orientation of the here five position receptacles 26 relative to each other expediently corresponds to the plug-in direction of a plug-in connector 9 to be connected.

In order to close the housing 1 also from the open side of the first housing half 2, a second housing half 3 is provided. This can be attached to the first housing half 2 and forms the housing 1 together therewith.

Figure 2:
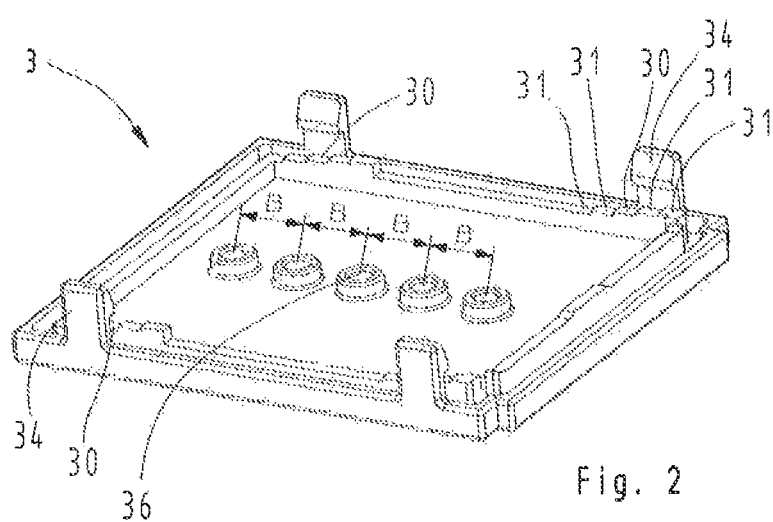
FIG. 2 shows a second housing half.

Such a second housing half 3 is shown in FIG. 2. Here, four latching means 34 have been moulded onto the component that is formed to be substantially flat. These latch, in the assembled state of the two housing halves 2, 3, with an equal number of four latching means 24 of the first housing half 2. The latching means 24 are here inserted into the walls of the first housing half 2.

Also another or an additional connection of the two housing halves 2, 3 is conceivable. Thus, in a further embodiment, these may for example be bonded together. It is also conceivable to have a unitary embodiment of the housing halves 2, 3, connected by a film hinge and latching means only on one side.

In the embodiment shown, the two housing halves 2, 3 additionally have a labyrinth seal in the transitional region. This prevents, when the housing 1 is moulded, any penetration of grouting material. However, this will not be explained in any more detail because it does not form part of the invention and is already known from a number of prior art documents.

On the inner side of the second housing half 3, as well as on the first housing half 2, position receptacles 36 are moulded. These position receptacles 36 are arranged axially symmetrically to the position receptacles 26 of the first housing half 2 and are also provided for receiving the positioning pins 7.

Further, two counter bearing pads 30 are each provided opposite each other on the inner side of the second housing half 3 in the marginal regions. These are used for the electric circuit board 50 to rest upon.

According to the invention, apart from the counter bearing pads 30 even further counter bearing pads 31 are provided on the second housing half 3. These further counter bearing pads 31 are moulded in a step-wise manner next to the counter bearing pads 30. In this embodiment example, there are two each at a higher level and two each at a lower level.

In this embodiment example, one counter bearing pad 30, 31 of the second housing half 3 is respectively associated with one bearing pad 20, 21 of the first housing half 2. The bearing pads 20, 21 and counter bearing pads 30, 31 form support pairs 20/30 as well as further support pairs 21/31. The support pairs 20/30, 21/31 form, with the housing halves 2, 3 assembled together, a reception gap for receiving a circuit board 50.

Figure 3:
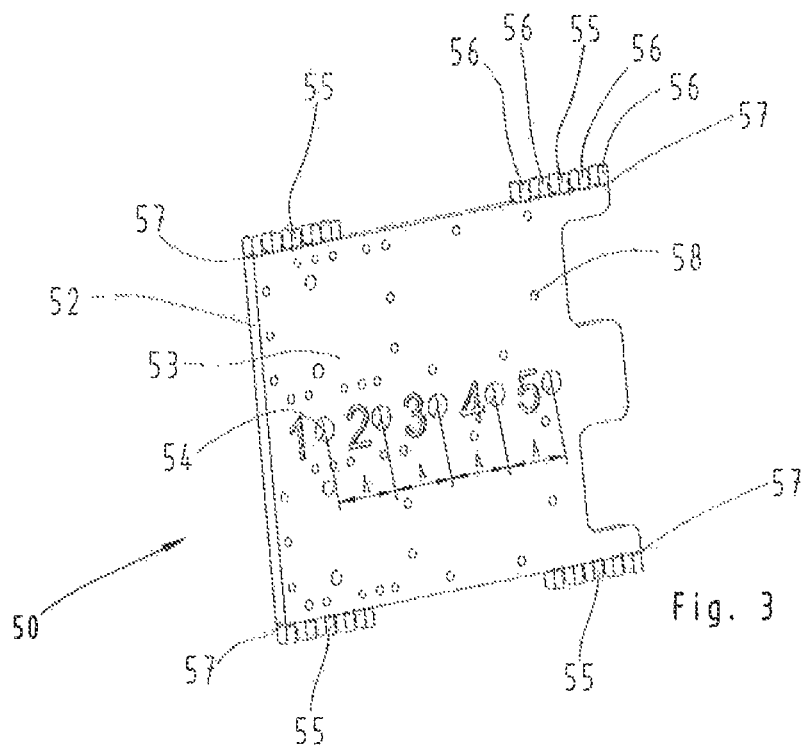
FIG. 3 shows a circuit board.

FIG. 3 shows a circuit board 50 to be received in the housing 1. The circuit board 50, which generally corresponds to the shape of the housing 1, expediently has a plurality of component bores 58. In these bores, electric components, plugs, interfaces or operating elements may be inserted and can for example be fastened by soldering. The type of these components will not be explained in any more detail because it is not relevant to the invention.

In the edge regions of the circuit board 50, a plurality of support points 55, 56 is provided. The positions of the support points 55 correspond to those of the support pairs 20/30. The positions of the additional support points 56 correspond to those of the further support pairs 21/31.

In the assembled condition, the circuit board 50 rests with its support points 55, 56 between the support pairs 20/30, 21/31. In doing so, the circuit board 50 contacts with a first surface 52 the bearing pads 20, 21 and with a second surface 53 the counter bearing pads 30, 31. Depending on the layout of the reception gap between the bearing pads 20, 21 and the counter bearing pads 30, 31 as well as the thickness of the circuit board 50, this will be supported between the support pairs 20/30, 21/31 either in a slightly movable or in a clamping manner.

The support points 55, 56 of the circuit board 50 are in each case moulded onto the circuit board 50 via a weakened material region 57, a so-called predetermined breaking point. On these predetermined breaking points, individual support points 55, 56 may be broken off and removed. As a result of the removal of, in this embodiment example, sixteen support points 55, 56, the remaining four support points 55, 56 and the level of the associated supports pairs 20/30, 21/31 results in the level of the circuit board 50 in the housing 1.

Figure 4A:
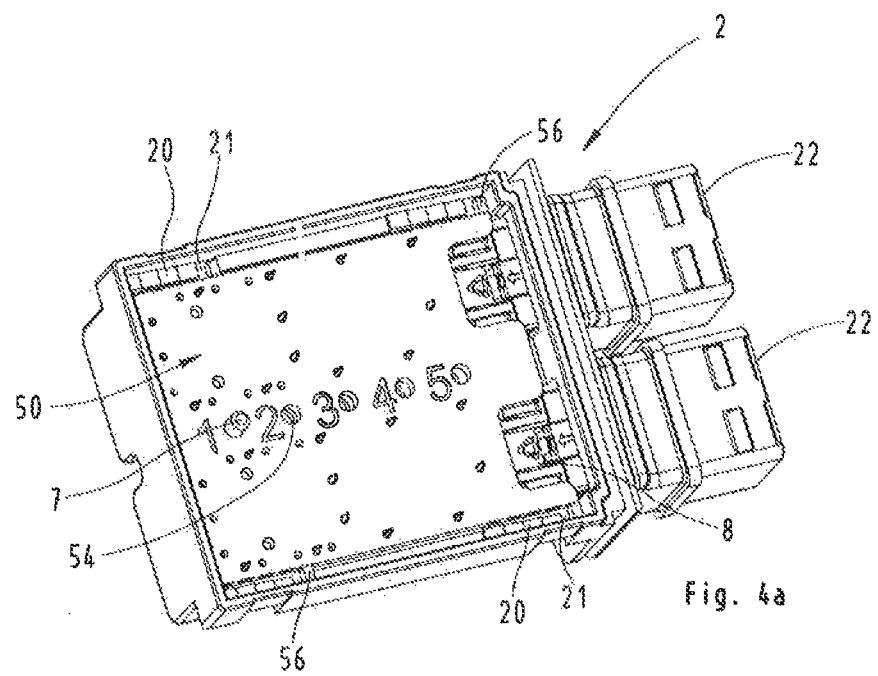

In order to show the level adaptation of the circuit board 50 in the housing 1 in a more accurate manner, FIGS. 4a-4c show three of five different possibilities, which will be described below.

All of the FIG. 4 show a first housing half 2 with a circuit board 5 inserted therein. Two components 8 are attached to the circuit board 50. These are not described in any more detail. Suffice it to say that the components 8 are provided for contacting by means of a plug-in connector 9 through the contacting openings 22.

In FIG. 4a, the four support points 55 as well as twelve additional support points 56 have been removed from the circuit board 50, so that only four additional support points 56 are present, which are shown on the right. As a result, there is a bottom level of the circuit board 50 on the lowermost bearing pads 21 located on the right.

In FIG. 4b, all of the sixteen additional support points 56 have been removed from the circuit board 50, so that only the support points 55 are present. As a result, there is a central level of the circuit board 50 on the bearing pads 20.

In FIG. 4c, the four support points 55 as well as sixteen additional support points 56 have been removed from the circuit board 50, so that only four additional support points 56 are present, which are each shown on the left. As a result, there is a top level of the circuit board 50 on the uppermost bearing pads 21 located on the left.

Apart from the level adjustment, FIGS. 4a-4c still show three positions of the circuit board 50, oriented in different ways, with plug-in connectors to be connected in the plug-in direction.

For fixing the circuit board 50 in the housing 1, a positioning pin 7 is inserted through one of here five position bores 54 in the circuit board 50 and in one of the position receptacles 26 in the first housing half 2. One position bore 54 is respectively associated with one of the position receptacles 26.

The distances A of the position bores 54 are greater than the distances of the position receptacles 26 from each other. As a result, depending on which position bore 54 and associated position receptacle 26 the positioning pin 7 is inserted into, a different orientation of the circuit board 50 in the housing 1 is obtained.

In FIG. 4a as shown, the direction of the contacting opening 22 is shown in the front position, in FIG. 4b in the central position and in FIG. 4c in the rear position, in the direction of the contacting openings 22.

Figure 5:
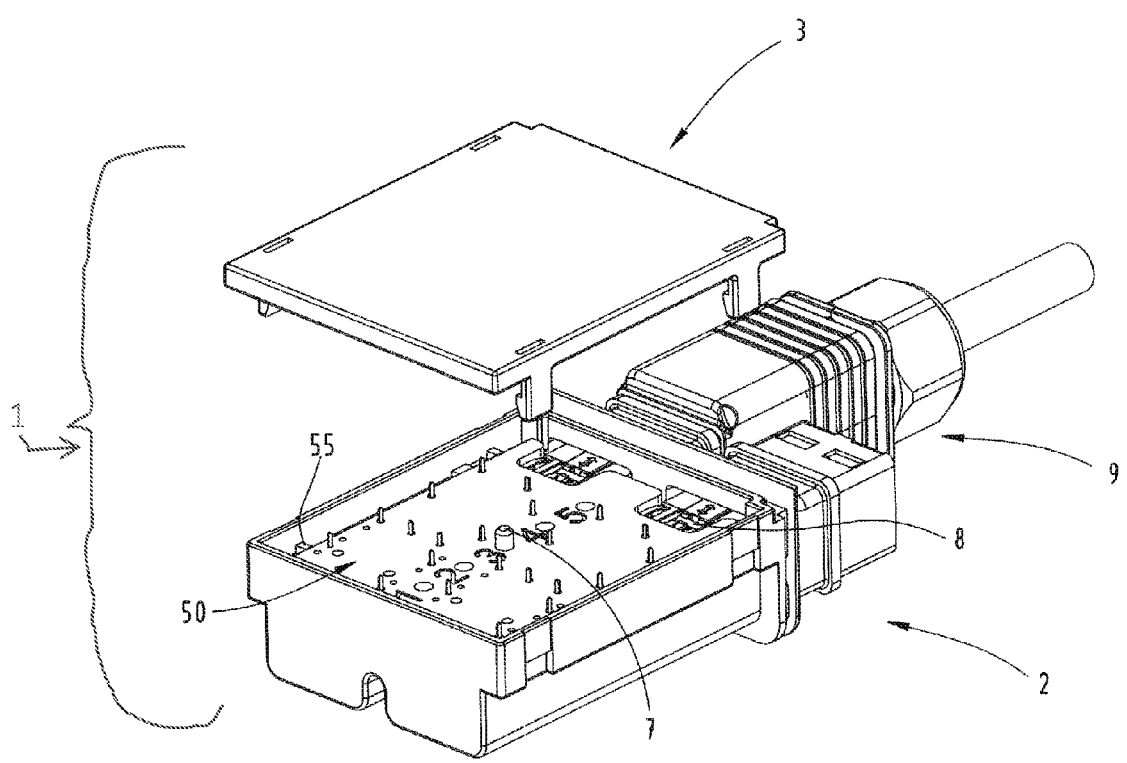
FIG. 5 shows an open housing with an inserted circuit board and a connected plug-in connector.

Finally, in FIG. 5 an entire assembly with a first housing half 2, a second housing half 3, a circuit board 50 and a connected plug-in connector 9 are shown.

The plug-in connector 9 is connected to one of two components 8 attached to the circuit board 50. In this respect, the plug-in connector 9 latches with the latching means 23 on one contacting opening 22 of the first housing half 2.

The second housing half 3 is shown above the first housing half 2 and only needs to be placed on top of the latter and latched by means of the latching means 24, 34.

LIST OF REFERENCE NUMERALS

1 Housing
2 First housing half
20 Bearing pads
21 Further bearing pads
22 Contacting opening
23 Latching means
24 Latching means
25 Cavity
26 Position receptacle
3 Second housing half
30 Counter bearing pads
31 Further counter bearing pads
34 Latching means
36 Position receptacle
20/30 Support pair
21/31 Further support pairs
50 Circuit board
52 First surface
53 Second surface
54 Position bore
55 Support points
56 Additional support points
57 Material weakening
58 Component bores
7 Positioning pin
8 Component
9 Plug-in connector
A Distance of the position bores 54
B Distance of the position receptacles 26, 36

The invention claimed is:

1. A housing and an electric circuit board received in said housing, said
   housing is formed from a first housing half and a second housing half,
   wherein said first housing half has at least two bearing pads and the second housing half has at least two counter bearing pads, which together form a first support group for supporting said circuit board at a first level between the first and second housing halves,
   wherein the bearing pads and the counter bearing pads define a reception gap having approximately the thickness of the circuit board,
   wherein the circuit board rests with a first surface facing the first housing half and rests with a second surface facing the second housing half, and wherein the circuit board includes first support points for supporting the circuit board on the bearing pads and the counter bearing pads of the housing, wherein said first housing half has at least two further bearing pads and said second housing half has at least two further counter bearing pads which together form a second support group for supporting said circuit board at a second level between the first and second housing halves, said first and second levels parallel to each other, and wherein said circuit board further comprises second support points for supporting the circuit board on the further bearing pads and further counter bearing pads and wherein said circuit board has at least two position bores arranged linearly at a distance (A) from each other, and at least one of the housing halves has at least two bores, wherein the housing half bores form position receptacles and are arranged linearly at a distance (B) from each other, and wherein at least one position receptacle is associated with at least one position bore of the circuit board and wherein the position bores and position receptacles are oriented axially parallel to each other.

2. The housing and circuit board as claimed in claim 1, further comprising a positioning pin inserted into one of the position bores and the associated position receptacle.

3. The housing and circuit board as claimed in claim 1, wherein distance (A) is different from distance (B).

4. The housing and circuit board as claimed in claim 1, wherein the bearing pads and further bearing pads, and the counter bearing pads and further counter bearing pads are each moulded in a step-wise manner next to each other in the housing halves.

5. The housing and circuit board as claimed in claim 1, wherein the reception gap is equal to or less than the thickness of the circuit board.

6. The housing and circuit board as claimed in claim 1, wherein the first and second support points can be separated from the circuit board.

7. The housing and circuit board of claim 6 wherein the first and second support points can be separated from the circuit board by material weakening.

* * * * *